United States Patent
Morimoto et al.

(10) Patent No.: US 6,858,512 B2
(45) Date of Patent: Feb. 22, 2005

(54) SEMICONDUCTOR DEVICE AND METHOD OF PRODUCING THE SAME

(75) Inventors: Yoshihiro Morimoto, Inazawa (JP); Kiyoshi Yoneda, Gifu (JP)

(73) Assignee: Sanyo Electric Co., Ltd. (JP)

( * ) Notice: Subject to any disclaimer, the term of this patent is extended or adjusted under 35 U.S.C. 154(b) by 129 days.

(21) Appl. No.: 09/820,140

(22) Filed: Mar. 28, 2001

(65) Prior Publication Data

US 2002/0000552 A1 Jan. 3, 2002

(30) Foreign Application Priority Data

Mar. 30, 2000 (JP) ............................. 2000-094535

(51) Int. Cl.$^7$ .............................................. H01I 21/20
(52) U.S. Cl. ..................... 438/384; 438/96; 438/97; 438/166; 438/365; 438/482; 438/486
(58) Field of Search ..................... 438/384, 96–97, 438/166, 365–368, 482–486, 688–712; 117/3–8

(56) References Cited

U.S. PATENT DOCUMENTS

| | | | | |
|---|---|---|---|---|
| 5,605,846 A | * | 2/1997 | Ohtani et al. | 437/21 |
| 5,607,599 A | * | 3/1997 | Ichihara et al. | 216/22 |
| 5,858,822 A | * | 1/1999 | Yamazaki et al. | 438/166 |
| 5,940,693 A | * | 8/1999 | Maekawa | 438/166 |
| 6,066,516 A | * | 5/2000 | Miyasaka | 438/149 |
| 6,113,690 A | * | 9/2000 | Yu et al. | 117/84 |
| 6,117,752 A | * | 9/2000 | Suzuki | 438/487 |
| 6,127,279 A | * | 10/2000 | Konuma | 438/745 |
| 6,238,582 B1 | * | 5/2001 | Williams et al. | 216/22 |
| 6,241,817 B1 | * | 6/2001 | Jang et al. | 117/8 |
| 6,288,417 B1 | * | 9/2001 | Nickel et al. | 257/103 |
| 6,342,421 B1 | * | 1/2002 | Mitani et al. | 438/300 |
| 6,403,495 B2 | * | 6/2002 | Kim et al. | 438/719 |
| 6,423,240 B1 | * | 7/2002 | Wang et al. | 216/22 |
| 6,455,360 B1 | * | 9/2002 | Miyasaka | 438/166 |
| 6,472,232 B1 | * | 10/2002 | Johnson et al. | 438/14 |
| 6,504,215 B1 | * | 1/2003 | Yamanaka et al. | 257/350 |
| 2001/0015170 A1 | * | 8/2001 | Kitabatake | 117/95 |

FOREIGN PATENT DOCUMENTS

| | | | | |
|---|---|---|---|---|
| JP | 06-163409 | * | 11/1992 | H01L/21/20 |
| JP | 2000-150890 | * | 11/1998 | H01L/29/786 |
| JP | 2002-076349 | * | 8/2000 | H01L/29/786 |
| JP | 2002-305148 | * | 1/2002 | H01L/21/20 |

* cited by examiner

Primary Examiner—Matthew Smith
Assistant Examiner—Granvill D. Lee, Jr.
(74) Attorney, Agent, or Firm—Cantor Colburn LLP

(57) ABSTRACT

An a-Si film (12) formed on an insulating substrate (10) is irradiated with a laser so that the a-Si film (12) is fused and recrystallized to form a p-Si film (13). Projections (100) generated on the p-Si film (13) at this stage are eliminated by irradiation of ion beams at the incident angle of 60° to 90° using an ion milling method to planarize the surface of the p-Si film (13), thereby creating sufficient insulation between the p-Si film (13) and gate electrodes (15).

10 Claims, 6 Drawing Sheets

SEMICONDUCTOR DEVICE AND METHOD OF PRODUCING THE SAME

BACKGROUND OF THE INVENTION

1. Field of the Invention

This invention relates to a semiconductor device and a method of producing the same, and more specifically to a semiconductor device comprising a semiconductor film having a planar surface and a method of producing such a semiconductor device.

2. Description of Related Art

A method of producing a thin film transistor (hereinafter referred to as a "TFT") will be described.

FIG. 1 depicts the condition of the surface of a polycrystallized silicon film. FIGS. 2A to 2D respectively depict cross sectional views taken along line A—A of FIG. 1 for showing production processes of a conventional TFT.

Step 1 (FIG. 2A):

On an insulating substrate 10 composed of a glass, a silica glass, or the like, an insulating film 11 composed of a single $SiO_2$ film or of an SiN film and an $SiO_2$ film is formed, and an amorphous silicon film (hereinafter referred to as an "a-si film") 12 is further formed thereon using a CVD method.

Step 2 (FIG. 2B):

The a-Si film 12 is annealed by irradiating the a-Si film 12 with linear excimer laser 14 such as XeCl, KrF, and ArF by scanning from one direction to another, so that the a-Si film 12 is fused and recrystallized for polycrystallization, to thereby form a polysilicon film (hereinafter referred to as a "p-Si film") 13.

At this time, irradiation of a surface of the a-Si film 12 with an excimer laser beam 14 in the direction shown by an arrow while scanning the a-Si film 12 causes the a-Si film 12 to be fused for recrystallization. Namely, the a-Si film 12, which is heated and fused by the laser radiation 14, is then cooled and recrystallized, thereby forming a p-Si film 13. At this time, however, grain boundaries in the crystal collide with each other causing these areas protrude as shown by projections 100.

Step 3 (FIG. 2C):

A gate insulating film 14 composed of an $SiO_2$ film is then formed over the entire surface of the p-Si film 13 using the CVD method. A metal film made of a refractory metal such as chromium (Cr) and molybdenum (Mo) is further formed thereon by a spattering method, and is processed into a predetermined shape by means of photolithography and a dry etching technology using RIE (Reactive Ion Etching), to thereby form gate electrodes 15.

Subsequently, for forming a P channel TFT, P type ions such as boron (B) are implanted (doped) with regard to the p-Si film 13 via the gate insulating film 14, with the gate electrodes 15 used as a mask. When an N type TFT is to be formed, on the other hand, N type ions such as phosphorous (P) are implanted in a similar manner. Thus, a portion of the p-Si film 13, which is an active layer, covered by the gate electrode 15 functions as a channel region 13c, and portions on both sides of the channel region 13c are a source region 13s and a drain region 13d, respectively.

An interlayer insulating film 16 formed from a single $SiO_2$ film or from two layers including $SiO_2$ and SiN films is further disposed using the CVD method.

Step 4 (FIG. 2D):

First contact holes 17 are then formed at locations corresponding to the drain region 13d and the source region 13s, respectively, such that they run through the interlayer insulating film 16 and the gate insulating film 14 to reach the p-Si film 13. Then, drain and source electrodes 19d, 19s, each composed of a multi-metal layer including aluminum and titanium in this order, are formed at the respective first contact holes 17 by patterning the deposited aluminum and titanium, by spattering, on the interlayer insulating film 16 through which each of the first contact holes 17 is formed, and which fills the first contact hole 17, for example.

Over the interlayer insulating film 16 on which the drain electrode 19d and the source electrode 19s are thus formed and over the drain and source electrodes 19d and 19s, a planarizing insulating film 20 is further disposed for surface planarization. The planarizing insulating film 20 is formed of an acrylic resin layer, which in turn is formed by applying and baking an acrylic resin solution. This acrylic resin layer can smooth the unevenness caused by the gate electrode 15 and the drain and source electrodes 19d and 19s, and planarize the surface.

Over the source electrode 19s, a second contact hole 21 is formed which passes through the acrylic resin layer, which is a planarizing insulating film 20. A pixel electrode 22 is then formed at the portion of this second contact hole 21 such that this electrode connects to the source electrode 19ss and extends over the acrylic resin layer. The pixel electrode 22 is formed in the following manner. A transparent conductive film, which is an ITO (Indium Tin Oxide) for example, is first disposed on the planarizing insulating film 20 having the second contact hole 21 formed therethrough. After a resist film is applied over the transparent conductive film in a predetermined electrode pattern, the exposed portion of the transparent conductive film is etched by a dry etching method such as the RIE method using HBr gas and $Cl_2$ as etching gas, to thereby form the pixel electrode 22.

TFTs produced in the above-described manner suffer from problems. As already described, when the a-Si film is fused and recrystallized by laser beam irradiation, the grain boundaries of the crystal collide with each other causing the surface of the p-Si film 13 to have projections 100. Therefore, the gate insulating film 14 formed above these projections has a smaller thickness at these projections 100. These projections can be as thick as the p-Si film. When the thickness of the p-Si film 13 is approximately 400 Å, for example, the projection may be as thick as 400 Å. This leads to a disadvantage that sufficient insulation may not be achieved between the p-Si film 13 and the gate electrode 15, or that, when the height of projection 100 is larger than the thickness of the gate insulating film 14, there is a short circuit between the p-Si film 13 and the gate electrode 15.

Further, concentration of electric field in the projection 100 due to applied voltages causes dielectric breakdown, which also results in possibility of short circuit between the p-Si film 13 and the gate electrode 15.

In addition, even when a uniform gate voltage is applied to the gate electrodes 15, a voltage which is actually applied to the p-Si film 13 varies within a surface of the insulating substrate. This results in a TFT having non-uniform characteristics. When such a TFT is employed in a display device such as a liquid crystal display, there is a possibility that variations in display characteristics are caused within the display screen.

SUMMARY OF THE INVENTION

The present invention is made so as to solve the foregoing problems of the related art, and it is an object of the present invention to provide a semiconductor device having excellent characteristics and a method of producing such a semiconductor device, in which projections generated on a semiconductor film are eliminated to planarize the film surface.

In accordance with the present invention, a method of producing a semiconductor device comprises the steps of forming a non-crystal semiconductor film on a substrate; heating said non-crystal semiconductor film: and eliminating projections generated by said heating on said non-crystal semiconductor film using a physical elimination method.

Further, in the above method of producing a semiconductor device, said heating step may comprise a step of applying laser beam irradiation for fusing and recrystallizing said non-crystal semiconductor film.

Further, in the above methods of producing a semiconductor device, said physical elimination method may comprise a method of applying ion beam irradiation to said projections to eliminate said projections.

Still further, in the above methods of producing a semiconductor device, an angle θ formed by the incident direction of the ion beam from said ion milling and the direction of the normal line of (the perpendicular with respect to) a surface of said non-crystal semiconductor film is 600° to 900°.

Also, in accordance with another aspect of the present invention, a semiconductor device comprises a substrate and a non-crystal semiconductor film formed on said substrate, wherein said non-crystal semiconductor film has a planar surface by eliminating, using ion beam irradiation, projections generated on said non-crystal semiconductor film due to heating of said film.

According to the present invention, projections generated on the surface of p-si (non-crystal semiconductor) film can be effectively eliminated such that the surface can be planarized using the ion milling method, allowing a semiconductor device having excellent characteristics can be obtained.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

An example will be described where a method of producing a semiconductor device according to the present invention is adopted for a liquid crystal display comprising TFTs.

Figure 1:
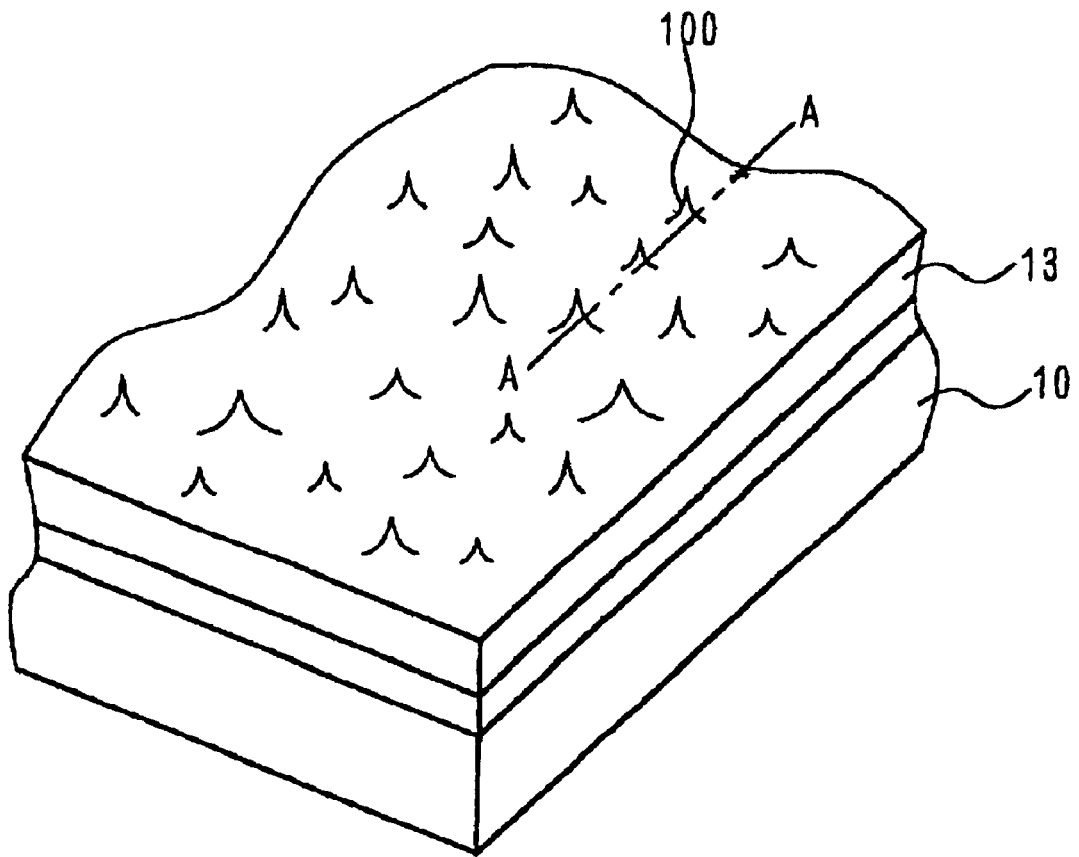
FIG. 1 shows a surface condition of a semiconductor device according to a related art.
Figure 2A:
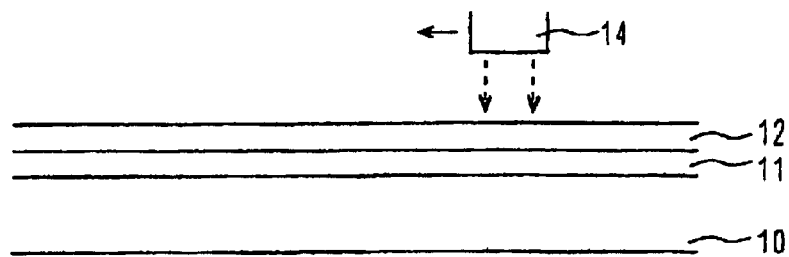
FIGS. 2A, 2B, 2C and 2D are cross sectional views for explaining processes of a production method of a semiconductor device according to a related art.
Figure 2B:
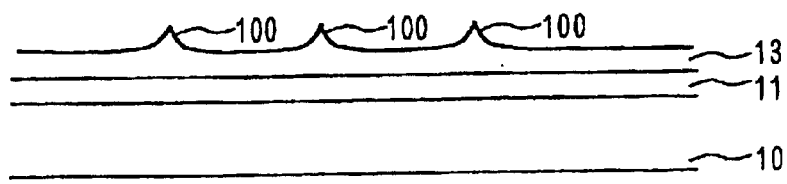
Figure 2C:
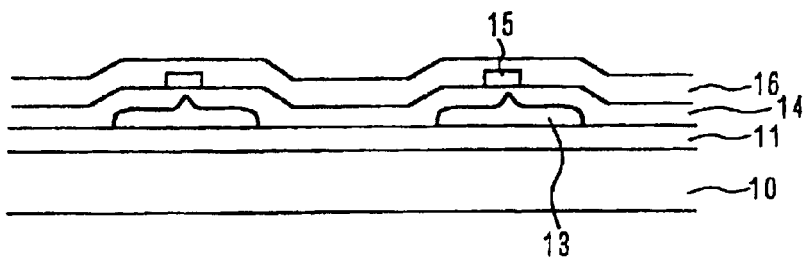
Figure 2D:
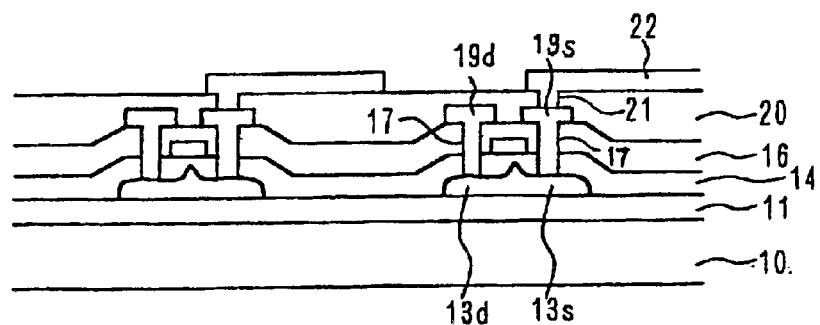
Figure 3A:
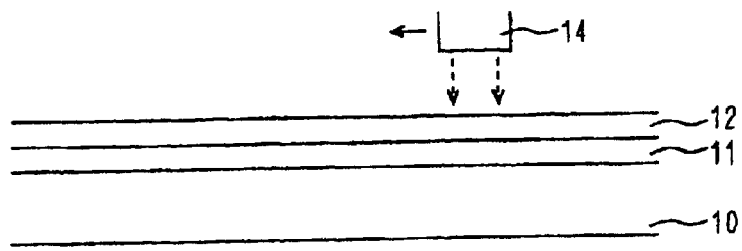
FIGS. 3A, 3B, 3C, 3D and 3E are cross sectional views for explaining processes of a production method of a semiconductor device according to the present invention.
Figure 3B:
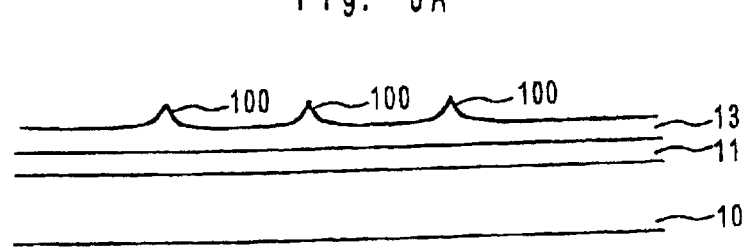
Figure 3C:
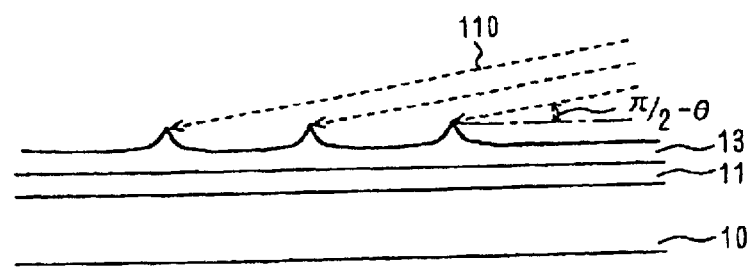
Figure 3D:
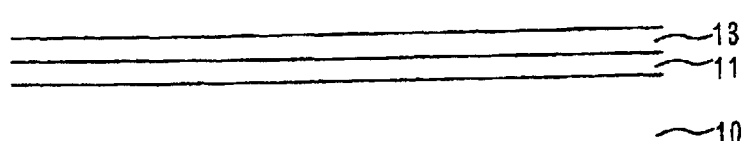
Figure 3E:
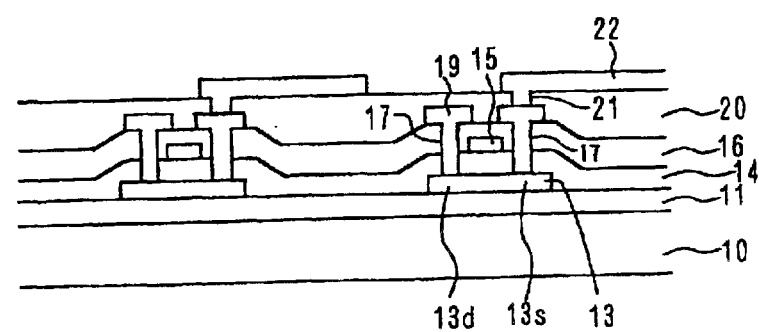
Figure 4:
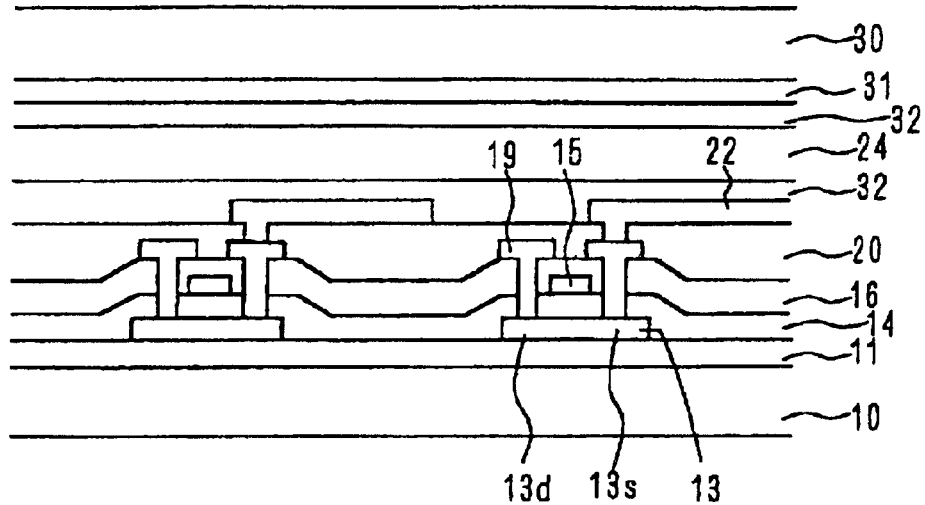
FIG. 4 is a cross sectional view of a liquid crystal display in which a semiconductor device of the present invention is employed.

FIGS. 3A to 3E are cross sectional views for explaining the producing processes of a TFT according to the present invention, and FIG. 4 is a cross sectional view of a liquid crystal display.

Step 1 (FIG. 3A):

On an insulating substrate 10 composed of a glass, a quartz glass or the like, an insulating film 11 composed of a single $SiO_2$ film or of an SiN film and an $SiO_2$ film is formed using the CVD method or the like, for the purpose of preventing impurities including sodium ions in the insulating substrate from entering a semiconductor film (p-Si film) formed thereon. When a nonalkaline glass substrate or the like which can be guaranteed to remain free of impurities is employed, formation of the insulating film 11 is not essential.

In the present invention, the insulating substrate includes a substrate having insulating properties in a surface. Namely, the insulating substrate may be formed from a semiconductor substrate having an insulating film 11 composed of an SiN film and an $SiO_2$ film deposited thereon.

An a-Si film 12 is then formed on the insulating film 11 using the CVD method. The thickness of the a-Si film 12 may be 300 Å to 1000 Å, but is set at 400 Å in example of the present embodiment.

Step 2 (FIG. 3B):

The a-Si film 12 is annealed by irradiating the a-Si film 12 with excimer laser formed in a linear shape having wavelength of 308 nm from one direction to the other for scanning, so that the a-Si film 12 is fused and recrystallized for polycrystallization, to thereby form a polysilicon film (hereinafter referred to as a "p-Si film") 13.

In this step, irradiation of a surface of the a-Si film 12 with an excimer laser light 14 causes the a-Si film 12 to be fused for recrystallization. Namely, the a-Si film 12, which is heated and fused by the laser irradiation, is then cooled and recrystallized, thereby forming a p-Si film. At this time, grain boundaries in the crystal collide causing portions to protrude as shown by projections 100.

As example lasers, an XeCl excimer laser having a wavelength λ of 308 nm or an ArF excimer laser having a wavelength λ of 193 nm may be used.

Step 3 (FIG. 3C):

According to this embodiment, the projections 100 are etched by irradiation using ion beams 110 applied from an ion milling apparatus.

More specifically, Ar ion irradiation 110 is applied to the p-Si film 13 in a direction which forms an angle θ with respect to the surface of the p-Si film 13.

Step 4 (FIG. 3D):

In this manner, the projections 100 on the surface of the p-Si film 13 are eliminated to thereby planarize the surface of the p-Si film 13.

Step 5 (FIG. 3E):

A gate insulating film 14 formed from an $SiO_2$ film is then disposed over the entire surface of the p-Si film 13 using the CVD method. A metal film made of a refractory metal such as Cr or Mo is further formed by a spattering method, and is processed into a predetermined shape by means of photolithography and a dry etching technology using RIE, to thereby form gate electrodes 15.

Subsequently, using the gate electrodes 15 as a mask, P type or N type ions are implanted into the p-Si film 13 via the gate insulating film 14. Namely, in accordance with the type of TFT to be formed, P or N type ions are implanted into the regions of the p-Si film 13 not covered by the gate electrodes 15.

More specifically, when forming a P channel TFT, P type ions such as boron (B) are implanted, whereas when forming an N type TFT, N type ions such as phosphorous (P) are implanted. Thus, a portion of the p-Si film 13, which is an active layer, covered by the gate electrode 15 functions as a channel region 13c, and portions on both sides of the channel region 13c are a source region 13s and a drain region 13d, respectively.

Then, an interlayer insulating film 16 composed of a single $SiO_2$ film or of two layers including $SiO_2$ and SiN films is further formed using the CVD method.

First contact holes 17 are then formed at locations corresponding to the drain and source regions 13d and 13s, respectively, such that they run through the interlayer insulating film 16 and the gate insulating film 14 to reach the p-Si film 13. Then, drain and source electrodes 19d and 19s, each composed of a multi-metal layer including aluminum and titanium in this order, are formed at the respective first contact holes 17 by patterning the deposited aluminum and titanium, by spattering, on the interlayer insulating film 16 through which each of the first contact holes 17 is formed. The aluminum also fills the first contact hole 17, for example.

Over the interlayer insulating film 16 on which the drain and source electrodes 19d and 19s are thus formed, and on the drain and source electrodes 19d and 19s, a planarizing insulating film 20 is further disposed for surface planarization. The planarizing insulating film 20 is formed from an acrylic resin layer, which in turn is formed by applying and baking an acrylic resin solution. This acrylic resin layer can smooth the unevenness caused by the gate electrode 15 and the drain and source electrodes 19d and 19s to planarize the surface.

Further, over the source electrode 19s, a second contact hole 21 is formed which passes through the acrylic resin layer, being the planarizing insulating film 20. A pixel electrode 22 is then formed at the portion of this second contact hole 21 so that it connects to the source electrode 19s and extends over the acrylic resin layer. The pixel electrode 22 is formed in the following manner. A transparent conductive film, which is an ITO (Indium Tin Oxide) for example, is first disposed on the planarizing insulating film 20 having the second contact hole 21 formed therethrough. After a resist film is applied over the transparent conductive film in a predetermined electrode pattern, the exposed portion of the transparent conductive film is etched by a dry etching method such as the RIE method using HBr gas and $Cl_2$ as etching gas, to thereby form the pixel electrode 22.

Then, for aligning the liquid crystal, an alignment layer 23 formed from polyimide, $SiO_2$, or the like is disposed over the pixel electrode 22 and the planarizing insulating film 20 using a printing method or a spinner method .

In this manner, a TFT substrate 10 which is one substrate of a liquid crystal display using a TFT which drives the liquid crystal as a switching element, is complete.

Next, on an opposing electrode substrate 30 which is an insulating substrate formed from a quartz glass or a nonalkaline glass, an opposing electrode 31 formed from a transparent conductive film such as an ITO film is disposed so as to cover the whole surface of the substrate 30, and an alignment film 32 formed from polyimide, $SiO_2$, or the like is formed thereon for aligning the liquid crystal 24.

The opposing electrode substrate 30 is thus disposed so as to face the above-referenced TFT substrate 10. The substrates 10, 30 are then adhered to each other using a sealing agent made of a resin having adhesive property, and which is provided between and in the vicinity of the TFT substrate 10 and the opposing electrode substrate 30. The liquid crystal 24 is then injected between these substrates 10, 30 to complete the liquid crystal display as shown in FIG. 4.

Now, the principle of an ion milling apparatus for eliminating the projections 100 generated on the surface of the p-Si film 13 will be described.

Figure 5:
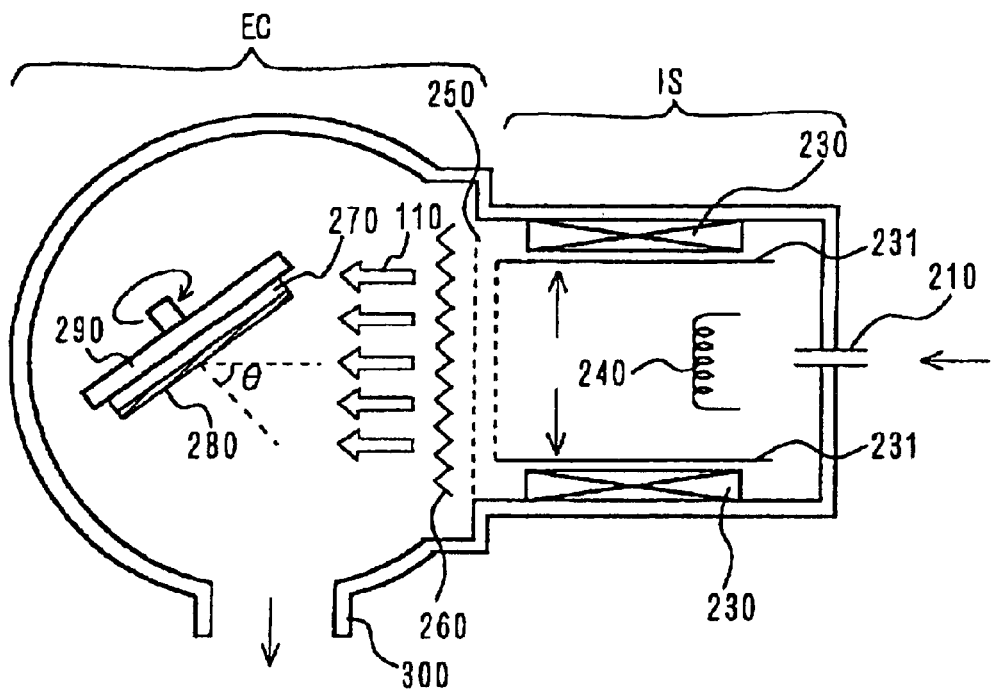
FIG. 5 is a cross sectional view of an ion milling device for use in the method of producing a semiconductor device according to the present invention.

FIG. 5 is a cross sectional view schematically showing an ion milling apparatus.

Referring to FIG. 5, the ion milling apparatus comprises an ion source region IS for generating ions and an etching chamber region EC for applying ion irradiation to an irradiation object to etch the object. Both regions are evacuated, with the degree of vacuum being $1 \times 10^{-6}$ Torr (1 Torr≈133 Pa).

The ion source region IS comprises a gas supply port 210 for supplying a gas, such as argon gas, which is ionized by a magnet 230; a cylindrical anode 231 surrounded by the magnet 230 for generating a magnetic field to cause a plasma gas; a cathode 240 composed of a filament for emitting a thermion; and an extraction electrode 250 for extracting Ar ions from the generated plasma.

The etching chamber region EC, on the other hand, comprises a neutralizer 260 for emitting electrons to neutralize Ar ions extracted by the extraction electrode 250; and a stage 290 for fixing the etching object. The chamber also includes an exhaust port 300 which uses a pumpt (not shown) for exhausting gases from the chamber.

A glass substrate 270, on which a p-Si film 280, the etching object, is formed to cover the whole surface, is fixed on the stage 290. The stage 290 is rotated at a predetermined rate, so that the p-Si film 280 disposed on the glass substrate 270 is uniformly irradiated with Ar atoms, as shown by arrows 110. At this time, the Ar atom irradiation applied from the ion source region IS enters the surface of the stage 270 at an angle which is inclined by θ with respect to the normal direction of the surface of the substrate 270. Namely, the Ar atoms enter the p-Si film 280 from the direction forming an angle of $((\pi/2)-\theta)$ with regard to the surface of the p-Si film 280. In this manner, the Ar atoms are applied at a predetermined angle θ with regard to the projections 100 generated due to the polycrystallization annealing on the p-Si film 280, thereby etching the projections 100. The angle θ may be optionally changed by adjusting the fixing angle of the stage 290.

In the above-described ion milling apparatus, the interior of the ion source region IS and the etching chamber region EC is evacuated using a diffusion pump or the like. Ar gases are then supplied via the gas supply port 210 into the ion source region IS while a voltage is applied to the anode electrode 231, the magnet 230, and the cathode 240, to thereby turn the Ar gases into a plasma condition. A voltage of approximately 800 V is applied to the extraction electrode 250 for extracting Ar ions from the Ar plasma into the etching chamber region EC. Electrons are then supplied from the neutralizer 260 and applied to the thus extracted Ar ions so that the Ar ions are combined with the electrons, thereby forming Ar atoms. The Ar atoms are then caused to collide with the p-Si film 280 on the glass substrate 270 which is fixed on the stage 290. The Ar atoms collide with the projections 100 generated on the surface of the p-Si film 280, thereby eliminating the projections 100.

The etching of the projections 100 using Ar atoms will next be described.

Figure 6A:
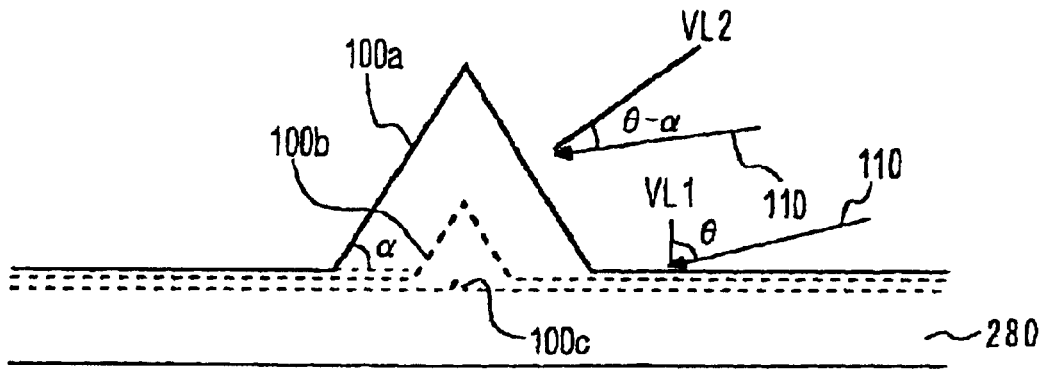
FIGS. 6A, 6B, and 6C are cross sectional views for explaining an etching process of the method of producing a semiconductor device according to the present invention.
Figure 6B:
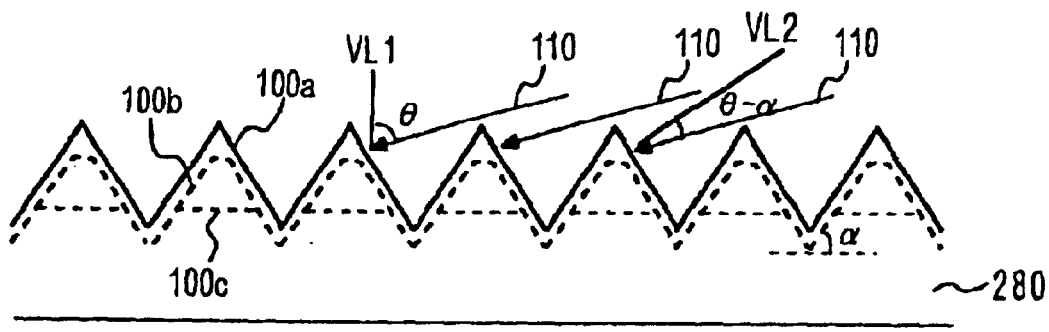
Figure 6C:
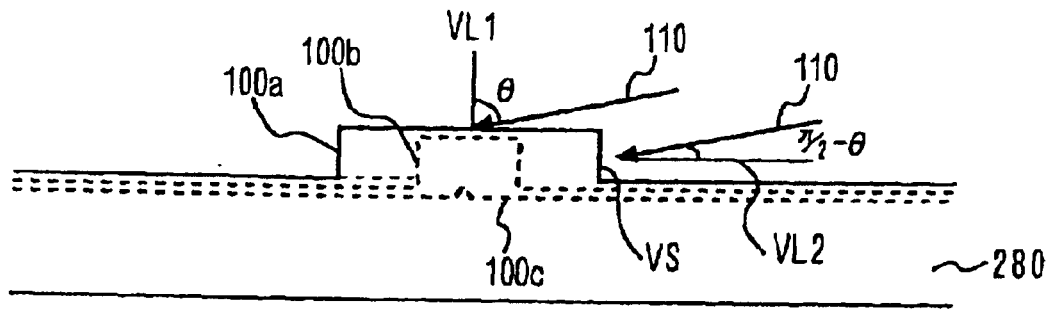

FIGS. 6A to 6C show how etching is performed with regard to projections having various shapes using Ar atom irradiation.

Specifically, FIGS. 6A, 6B and 6C respectively show etching for a conical projection, a plurality of conical projections disposed in series, and a projection having a rectangular cross section.

Referring first to FIG. 6A, etching of a conical projection will be described.

In this example, a projection 100 has an elevation angle α with regard to the surface of the p-Si film 280, and Ar atoms enter the surface of the p-Si film 280 from a direction which is inclined by an angle θ with regard to the perpendicular (normal line) VL1 of the film surface.

In this case, Ar atoms enter the slope of the conical projection 100 from a direction inclined by an angle (θ−α) with regard to the perpendicular VL2 of the slope. Because the slope of the projection 100, although inclined, forms a flat plane on the surface of the p-Si film, the Ar atoms enter this flat surface.

At this point, the glass substrate 10 on which the p-Si film 280 is formed is fixed on the stage 290 and therefore rotates with the stage 290, so that the whole surface of the p-Si film 280 is uniformly irradiated with the Ar atoms. Namely, the Ar atoms are sequentially applied to the slope of the projection and the planar portions of the p-Si film 280. However, as already described, the incident angle θ−β of the Ar atoms with regard to the slope of the projection 100 differs from the incident angle θ of the Ar atoms with regard to other planar portions. Because the etching rate of the ion milling which will be described depends on the beam incident angle, the projection 100a is etched at a higher rate than the planar portions of the p-Si film other than the projection. Consequently, the projection 100a is sequentially etched into a smaller projection 100b, 100c, to be finally eliminated completely. As a result, a p-Si film 13 having a planar surface can be obtained.

Referring next to FIG. 6B, the milling effect for a plurality of conical projections formed in series will be described.

As in the example the projection shown in FIG. 6A, this example again describes a projection 100 having an elevation angle a with regard to the surface of the p-Si film 280, and Ar atoms entering the surface of the p-Si film 280 from a direction inclined by an angle θ with regard to the normal line VL1 of the p-Si film. In this case, Ar atoms enter the slope of each conical projection 100 from a direction inclined by an angle (θ−α) with regard to the normal line VL2 of the slope. Consequently, each projection 100 is sequentially etched into a smaller projection as shown by 100a, 100b, and 100c, so that the surface of the p-Si film 280 can be planarized.

Next, referring to FIG. 6C, the milling effect for a cylindrical projection will be described.

In this example, a projection 100 projects vertically with regard to the planar surface of the p-Si film 280, and Ar atoms 110 enter the p-Si film 128 from a direction inclined by an angle θ with regard to the normal line VL1 of the planar surface of the p-Si film 280.

In this case, the surface direction of the top surface of the projection 100 corresponds with that of the planar surface of the p-Si film 280. On the other hand, Ar atoms enter the side surface of the projection 100 from a direction inclined by an angle $((\pi/2)-\theta)$ with regard to the normal line VL2 of the side surface VS. Here, the side surface VS also forms a planar surface.

Therefore, the incident angle of the Ar atoms with regard to the side surface VS of the projection 100 differs from the incident angle of the Ar atoms with regard to the planar surface of the p-Si film 280 and the top surface of the projection 100. When the p-Si film 280 is sequentially irradiated with the Ar atoms, the side surface VS of the projection 100 is selectively etched rather than the top surface thereof. Consequently, the projection 100a is sequentially etched into a smaller projection 100b, 100c, to be finally eliminated completely. As a result, a p-Si film 13 having a planar surface can be obtained.

The relationship between the irradiation angle of Ar atoms and the etching rate of the p-Si film when the p-Si film is irradiated with Ar atoms will next be described.

Figure 7:
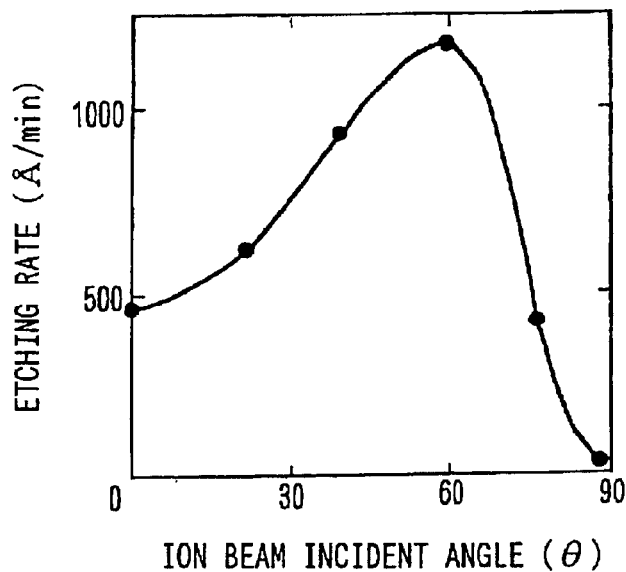
FIG. 7 is a characteristics view showing a relationship between the incident angle of ion beams and the etching rate according to the present invention.

FIG. 7 depicts a relationship between the irradiation angle of Ar atoms and the etching rate of the p-Si film when the p-Si film having a planar surface is irradiated with Ar atoms. In FIG. 7, the horizontal axis depicts the irradiation angle of At atoms with regard to the normal direction of the p-Si film surface whereas the vertical direction depicts the etching rate at which the p-Si film is etched by the Ar atoms.

As shown in FIG. 7, the etching rate for etching silicon varies according to the incident direction of Ar ions (Ar ion beams). FIG. 7 shows a case where the beam energy of Ar atoms is 500 eV and the current density of Ar atoms is 1.4 mA/cm$^2$.

The etching rate gradually increases as the incident angle θ of Ar atoms increases from 0°, to reach the maximum when θ is 60°. The etching rate then decreases sharply in the vicinity of the angle θ being 60° to 90°.

The etching of a conical projection shown in FIG. 6A will be described again. In order to eliminate a projection by irradiation of ion beams, it is preferable that the etching rate for the projection be high while the etching rate for the planar surface of the film be low. Namely, in the case of conical projection shown in FIG. 6A, it is also preferable that the projection 100a is etched quickly while the planar surface of the film is difficult to etch.

An example case wherein the incident angle θ of the ion beams is 88° and the angle α of the conical projection with regard to the surface of the p-Si film 13 is 60° will be described in the following.

More specifically, in FIG. 6A, the beam incident angle is the angle θ, being 88° with respect to the perpendicular VL1, and ion beams enter the planar portion of the p-Si film 280 at this incident angle. On the other hand, the beam incident angle is (θ−α), or 28° (=88°−66°) with respect to the normal line VL2 of the slope of the projection 100. Referring again to FIG. 7, when the planar surface of the p-Si film is irradiated at the incident angle of 88°, the etching rate is approximately 100 Å/min whereas when the incident angle is 28°, the etching rate is approximately 600 Å/min. Namely, the projection is etched about six times faster than the planar portion of the p-Si film, so that etching of the projection can be completed without etching a significant portion of the planar surface.

For the projections having various shapes as shown in FIGS. 6A to 6C, it is also possible to effectively etch the projections without etching the planar portions of the film, by appropriately selecting the incident angle of the ion beams such that the etching rate for the projection is higher than the that for the planar portions.

Figure 8:
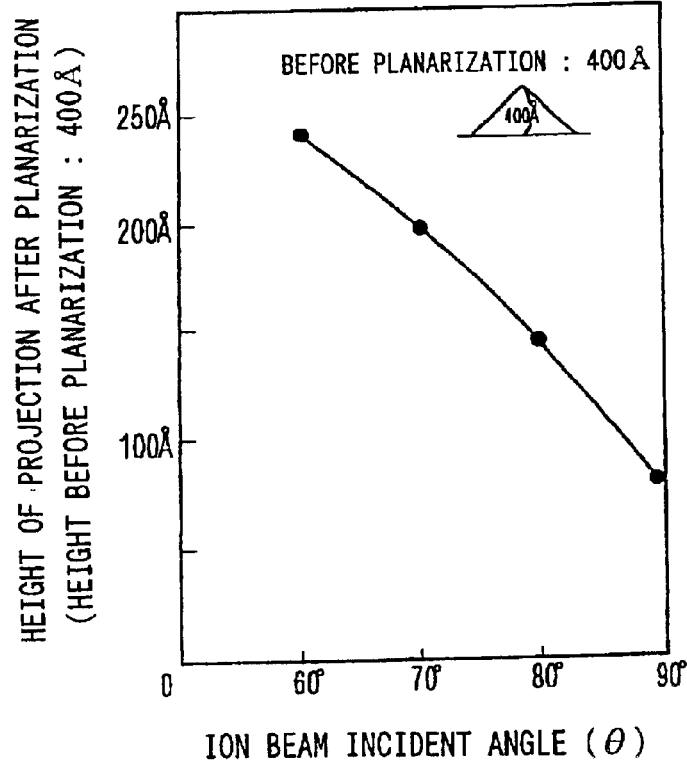
FIG. 8 is a view showing a relationship between the incident angle of ion beams and the height of a projection after planarization according to the present invention.

FIG. 8 depicts an example of a projection formed on a p-Si film after the p-Si film is irradiated with Ar atoms at different incident angles. In FIG. 8, the horizontal axis shows angle with respect to the normal line of the substrate surface, and the vertical axis shows the average height of a projection on the p-Si film after the Ar atom irradiation. In this example, the average height of the projection is 400 Å and the projection has a conical shape as shown in FIG. 8.

As shown in FIG. 8, as the incident angle increases, the projection becomes lower and is eliminated, so that the surface of the p-Si film is planarized.

It is desirable that the projection of the p-Si film which is an active layer not be high because, when the projection penetrates through the insulating film formed thereon, not only can the insulation property not be obtained, but the active layer may also short-circuit the conductive layer formed on the insulating film. It is therefore preferable for the remaining projecting p-Si film to have a thickness capable of substantially maintaining the insulation property.

Consequently, because a projection of 250 Å is tolerable, the incident angle may be 60°. Further, as a projection of 200 Å is more preferable, the incident angle may be 70°. Still further, because a remaining projection of 150 Å is still more preferable, the incident angle may be 80°.

As described above, sufficient insulation can be achieved between the p-Si film 13 and the gate electrodes 15, by applying ion beam irradiation onto the projections generated on the surface of the p-Si film using the ion milling method to planarize the surface. Further, even when the height of the projection 100 is larger than the thickness of the gate insulating film 14, a short circuit between the p-Si film 13 and the gate electrodes 15 can be prevented by eliminating the projections 100 to thereby planarize the surface by ion milling.

The elimination of the projections 100 can also solve the problem of concentration of electrical field in the projection when a voltage is applied to the p-Si film.

Further, the problem with the related art that, even when a uniform gate voltage is applied to the gate electrodes 15, a voltage which is actually applied to the p-Si films 13 varies within a surface of the insulating substrate such that the characteristics of a TFT become non-uniform, can be reduced. As a result, when a TFT according to the present invention is employed in a display such as liquid crystal display or the like, variations of display characteristics within the display screen can be eliminated.

In the foregoing embodiment, a glass substrate 270 forming a single liquid crystal display panel is fixed on the stage 290. However, the glass substrate 270 may be a so-called mother glass for forming a plurality of liquid crystal display panels, which can provide similar effects. The glass substrate 270 may also be formed from a glass having a low melting point, because, with the present invention, a-Si can be polycrystallized at a low temperature using laser annealing.

While the preferred embodiment of the present invention has been described using specific examples and terms, such description is for illustrative purposes only, and it is to be understood that changes and variations may be made without departing from the spirit or scope of the appended claims.

What is claimed is:

1. A method of producing a semiconductor device, comprising the steps of:

forming a non-crystal semiconductor film on a substrate;

heating said non-crystal semiconductor film; and applying ion beam irradiation to a surface of a recrystallized semiconductor film obtained through the heating step at an angle of incidence of greater than 0° with respect to a direction of normal of the surface of said recrystallized semiconductor film, wherein projections generated on the surface of said recrystallized semiconductor film is eliminated by said application of ion beam irradiation.

2. A method of producing a semiconductor device according to claim 1, wherein said elimination of projections through said application of ion beam irradiation is executed using an ion milling method.

3. A method of producing a semiconductor device according to claim 1, wherein an angle θ formed by an incident direction of the ion beam and a direction of a normal line of a surface of said recrystallized semiconductor film is 60° to 90°.

4. A method of producing a semiconductor device according to claim 1, wherein said heating step comprises a process of applying laser beam irradiation for fusing and recrystallizing said non-crystal semiconductor film.

5. A method of producing a semiconductor device according to claim 4, wherein said elimination of projections through said application of ion beam irradiation is executed using an ion milling method.

6. A method of producing a semiconductor device according to claim 5, wherein an angle θ formed by an incident direction of the ion beam milling and a direction of a normal line of the surface of said recrystallized semiconductor film is 60° to 90°.

7. A method of producing a semiconductor device according to claim 1, wherein said ion beam irradiation is applied after said non-crystal semiconductor film is fused and recrystallized through said heating step and before an insulating film is formed covering the recrystallized semiconductor film obtained through the fusing and recrystallization.

8. A semiconductor device comprising:

a substrate; and recrystallized semiconductor film formed on said substrate, wherein said recrystallized semiconductor film has a planar surface formed by eliminating, using ion beam irradiation with a tilted angle of incidence from a direction of normal of a surface of said recrystallized semiconductor film, projections generated on said recrystallized semiconductor film obtained through heating of a non-crystal semiconductor film formed on said substrate.

9. A semiconductor device according to claim 8, wherein an insulating film is formed on said recrystallized semiconductor film having a planar surface through said ion beam irradiation.

10. A semiconductor device according to claim 9, wherein an electrode layer is formed on said insulating film at least in a partial region to oppose said recrystallized semiconductor film with said insulating film therebetween.

* * * * *